(12) United States Patent
Heid

(10) Patent No.: US 6,437,566 B1
(45) Date of Patent: Aug. 20, 2002

(54) METHOD FOR PRESCRIBING A REFERENCE QUANTITY FOR A GRADIENT FIELD

(75) Inventor: Oliver Heid, Gunzenhausen (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/677,240

(22) Filed: Oct. 2, 2000

(30) Foreign Application Priority Data

Oct. 1, 1999 (DE) .......................................... 199 47 360

(51) Int. Cl.[7] ................................................. G01V 3/00
(52) U.S. Cl. ........................................ 324/309; 324/307
(58) Field of Search .................................. 324/307, 309, 324/313, 318, 322

(56) References Cited

U.S. PATENT DOCUMENTS

| | | | |
|---|---|---|---|
| 4,585,995 A | 4/1986 | Flugan | 324/322 |
| 4,703,275 A | 10/1987 | Holland | 324/318 |
| 4,928,063 A | 5/1990 | Lampman et al. | 324/307 |

*Primary Examiner*—Edward Lefkowitz
*Assistant Examiner*—Brij B. Shrivastav
(74) *Attorney, Agent, or Firm*—Schiff Hardin & Waite

(57) ABSTRACT

In a method for prescribing a time-variable referencequantity for a gradient field of a gradient coil of a magnetic resonance tomography apparatus, the referencequantity exhibits no pre-distortion that compensates eddy currents in a first time segment that is not a transmission or reception time segment of the radio-frequency signal; and the referencequantity exhibits a pre-distortion that corrects eddy currents in a second time segment that is a transmission or reception time segment of a radio-frequency signal.

11 Claims, 2 Drawing Sheets

METHOD FOR PRESCRIBING A REFERENCE QUANTITY FOR A GRADIENT FIELD

BACKGROUND OF THE INVENTION

1. Field of the Invention

The present invention is directed to a method for prescribing a temporally variable referencequantity for a gradient field of a gradient coil of a magnetic resonance tomography apparatus.

2. Description of the Prior Art

Magnetic resonance tomography is a known technology for acquiring images of the body interior of a living examination subject. To that end, rapidly switched gradient fields that are generated by a gradient coil system are superimposed on a static basic magnetic field in a magnetic resonance tomography apparatus. The magnetic resonance tomography apparatus also has a radio-frequency system that emits radio-frequency signals into the examination subject for triggering magnetic resonance signals. The radio-frequency system also registers the generated magnetic resonance signals from which magnetic resonance images are produced.

The gradient coil system usually is surrounded by conductive structures wherein eddy currents are induced by the switched gradient fields. Examples of such conductive structures are the inner cold shield of a super-conductive basic field magnet system, copper foil of a radio-frequency shielding, and the gradient coil system itself. The fields generated by the eddy currents are unwanted because, without counter-measures, measures, they weaken the gradient field and distort its time curve. This leads to degradations in the quality of magnetic resonance images.

The aforementioned eddy current fields can be compensated to a certain extent by an appropriate pre-distortion of a referencecurrent quantity of the gradient coil. Only eddy current fields that similarly track the gradient field in the mathematical sense, i.e. that are similar to the gradient field in terms of their field course, can be compensated by the pre-distortion. Since, however, eddy currents also exist that do not similarly track the gradient field, additional spatial field distortions referred to as higher order distortions arise. Actively shielded gradient coils are utilized in order to largely compensate these latter field distortions.

The basic functioning of known pre-distortion techniques described, for example, in U. S. Pat. No. 4,585,995 and U.S. Pat. No. 4,703,275. The calculation of the pre-distortion is essentially based on the perception that excited and decaying eddy currents can be described by a specific number of e-functions with different time constants. Transferred to an electrical network for the compensation of eddy currents, this means that the pre-distortion can be implemented with filters having different limit frequencies. The setting of the time constants or limit frequencies ensues, for example, by an operator who determines the optimum values at the installed magnetic resonance tomography apparatus by step-by-step modification of settings of the pre-distortion, with repeated review and re-adjustment. Depending on the experience of the operator, this setting is more or less time-consuming. In other known systems, the setting of the time constants or limit frequencies ensues automatically, as disclosed, for example, in U.S. Pat. No. 4,928,063.

In the execution of a measuring sequence, the pre-distortion of the referencecurrent quantity is implemented continuously during the entire time of the measuring sequence. For example, the pre-distortion is thereby implemented in a digital signal processor of a gradient system according to supporting points before a digital-to-analog conversion of the referencecurrent quantity. This represents a considerable calculating out lay for the digital signal processor and accordingly requires a powerful, and thus expensive, processor. Moreover, extra power capacity ([power reserves]) must be kept available due to the pre-distortion, which necessitates a more powerful and thus more expensive dimensioning of the gradient amplifiers.

SUMMARY OF THE INVENTION

It is an object of the invention to provide a method for prescribing a temporally variable referencequantity for a gradient field of a gradient coil of a magnetic resonance tomography apparatus that reduces the aforementioned disadvantages and, in particular, reduces the necessity of maintaining power reserves in the gradient amplifiers and simplifies the calculation of the pre-distortion.

The above object is achieved in accordance with the principles of the present invention in a method for prescribing a temporally variable reference quantity for a gradient field produced by a gradient coil in a magnetic resonance tomography apparatus, wherein the reference quantity exhibits no pre-distortion for compensating eddy currents in a first time segment that is not a transmission or reception time segment of the radio-frequency signal in the tomography apparatus, and wherein the reference quantity exhibits a pre-distortion that compensates eddy currents in a second time segment that is a transmission or reception time segment for the radio-frequency signal.

Because the referencequantity does not exhibit any pre-distortion compensating eddy currents in a first time segment that is not a transmission or reception time segment of the radio-frequency signal, and because the reference quantity exhibits a pre-distortion compensating eddy currents in a second time segment that is a transmission or reception time segment of the radio-frequency signal, a gradient amplifier supplying the gradient coil is freed from maintaining power reserves during the first time segment. Foregoing a pre-distortion during the first time segment is particularly possible because an exact adherence of the gradient field to a prescribable curve shape is not important for the generation of magnetic resonance images in time segments wherein no radio-frequency signal is transmitted or received; rather, the exact adherence to a prescribable gradient time area or, mathematically expressed, the adherence to a prescribable, $0^{th}$ time moment of the gradient field, is important. Further, a supporting location-dependent calculation of the pre-distortion for first time segments is completely eliminated during the course of a measuring sequence implementation. The calculating outlay to be performed is thereby reduced.

A great number of measuring sequences are characterized by the gradient field having a temporally constant gradient during the second time segment wherein a radio-frequency signal is transmitted or received. Due to this fact, the pre-distortion is implemented during the second time segment as follows with a reduced calculating outlay. As a result of the gradient field having a temporally constant gradient, no new eddy current is excited during the second time segment, so that only decaying eddy currents need be compensated for the pre-distortion, these having been excited in chronologically preceding time segments.

DESCRIPTION OF THE PREFERRED EMBODIMENTS

Figure 1:
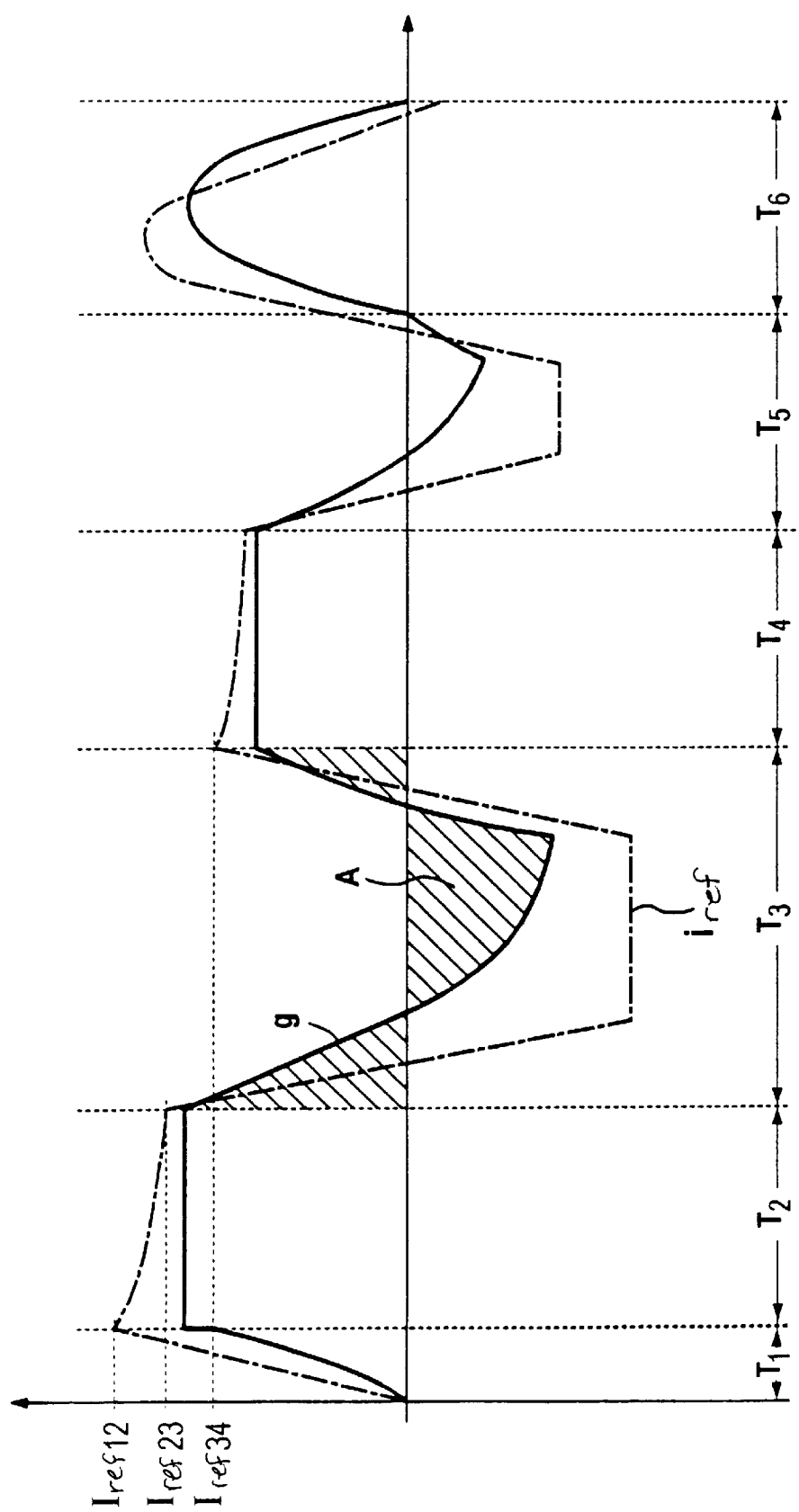
FIG. 1 is a time curve of a referencecurrent quantity and a resulting gradient field for use in explaining the inventive method.
Figure 2:
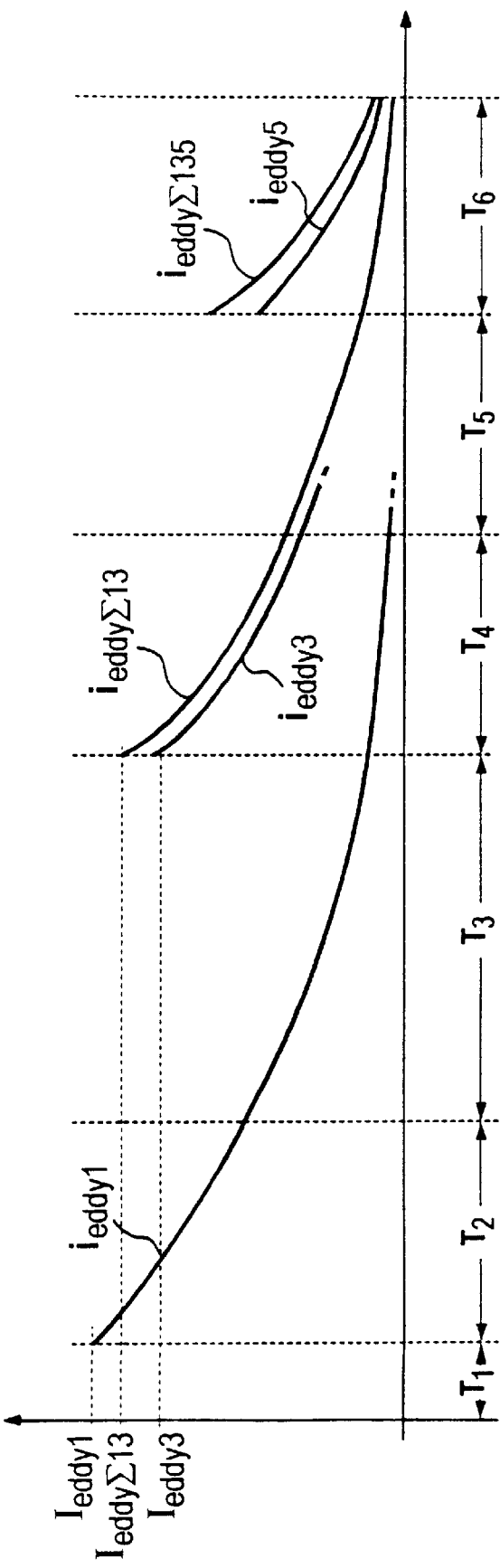
FIG. 2 is a time curve of eddy currents for use in explaining the inventive method.

For an exemplary embodiment of the invention, FIG. 1 shows a time curve of a referencecurrent quantity $i_{ref}$ for a gradient coil of a magnetic resonance tomography apparatus and a time curve of a gradient field g resulting therefrom. FIG. 2 shows corresponding, time curves of eddy currents. Six time segments $T_1$, $T_2$, $T_3$, $T_4$, $T_5$ and $T_6$ are shown. In the time segments $T_1$, $T_3$ and T. no transmission or reception of a radio-frequency signal of the magnetic resonance tomography apparatus takes place. By contrast the time segments $T_2$, $T_4$ and $T_6$ are time segments wherein the apparatus is in a radio-frequency transmission or reception mode. A pre-distortion of the referencecurrent quantity $i_{ref}$ occurs during the time segments $T_2$, $T_4$ and $T_6$. No pre-distortion is carried out in the time segments $T_1$, $T_3$ and $T_5$.

Due to the pre-distortion during the time segments $T_2$ and $T_4$, a constant, resulting gradient field g is set as desired. A calculation of the pre-distortion of the referencecurrent quantity $i_{ref}$, simply ensues on the basis of the following consideration. During the time segments $T_2$ and $T_4$, the resulting gradient field g is constant, so that no new eddy currents are excited. Only a decaying eddy current $i_{eddy1}$ having an initial value $I_{eddy1}$ that is present at the beginning of the time segment $T_2$ and that arises from eddy current excitation during the time segment $T_1$, needs to be taken into consideration for the calculation of the pre-distortion during the time segment $T_2$.

A decaying aggregate eddy current $i_{eddy\Sigma13}$ having an initial value $i_{eddy\Sigma13}$ needs to be taken into consideration for the calculation of the pre-distortion during the time segment $T_4$. The aggregate eddy current $i_{eddy\Sigma l3}$ is composed of the sum of two eddy currents. A first eddy current $i_{eddy3}$ is present with an initial value $i_{eddy3}$ at the beginning of the time segment $T_4$ and arises from an eddy current excitation during the time segment $T_3$. A second eddy current is the eddy current $i_{eddy1}$ that has decayed farther with the passage of time.

During the time segment $T_6$, as desired, a sinusoidal, resulting gradient field g is generated. The referencecurrent quantity $i_{ref}$ is thereby pre-distorted on the basis of the following consideration. Similar to the time segments $T_2$ and $T_4$, a decaying aggregate eddy current $i_{eddy\Sigma135}$ is to be compensated, this being composed of the sum of two eddy currents. A first eddy current $i_{eddy5}$ arises from an eddy current excitation during the time segment $T_5$, and a second eddy current is the aggregate current $i_{eddy\Sigma13}$ that has decayed farther with the passage of time. So that the resulting gradient field g corresponds to the desired, sinusoidal curve, and differing from the time segments $T_2$ and $T_4$, an eddy current is to be additionally compensated in the time segment $T_6$. This eddy current was generated during the time segment $T_6$ as a consequence of the temporally non-constant gradient field g. The pre-distortion of the referencecurrent quantity $i_{ref}$ for the compensation of the eddy current excited during the time segment $T_6$ is identified and implemented, for example, chronologically preceding an output of the referencecurrent quantity $i_{ref}$. The pre-distortion of the referencecurrent quantity $i_{ref}$ for the compensation of the decaying eddy current $i_{eddy\Sigma135}$, which can be described by simple exponential functions, is continuously implemented, for example, at the output of the referencecurrent quantity $i_{ref}$.

No pre-distortion occurs during the time segments $T_1$, $T_3$ and $T_5$. The curve of the referencecurrent quantity $i_{ref}$ at the start of the time segment $T_1$ during the time segment $T_1$ is prescribed by the value 0 and by a referencecurrent value $i_{ref2}$ at the end. This referencecurrent value $i_{ref2}$ is defined by a constant value of the gradient field occurring in the time segment $T_2$ and implicitly taken into account the eddy current $i_{eddy1}$ excited in the time segment $T_1$ with the value $i_{eddy1}$. The curve of the referencecurrent quantity $i_{ref}$ from the value 0 to the value $i_{ref2}$ during the time segment $T_1$ is configured such that minimum demands on the current-generating gradient amplifier. This is illustrated with a linear ramp in FIG. 1.

The curve of the referencecurrent quantity $i_{ref}$ is defined by three values for the time segment $T_3$. So that values of the gradient field g defined in the neighboring time segments $T_2$ and $T_4$ are adhered to, the referencecurrent quantity $i_{ref}$ at the start of the time segment $T_3$ is defined by a value $i_{ref23}$ and is defined at the end by a value $i_{ref34}$. Since the time segment $T_3$ is not a radio-frequency transmission or reception segment, a linear or constant course of the gradient field g is not important, but only adherence to a specific $0^{th}$ time moment A of the gradient field g is important, so that a prescribable, $0^{th}$ time moment A of the gradient field g is to be adhered to as the third value in the time segment $T_3$. For example, it is prescribed that the $0^{th}$ time moment A of the gradient field g is equal to zero. With the aforementioned intentional omissions, the curve of the referencecurrent quantity $i_{ref}$ for the time segment $T_3$ is calculated without pre-distortion and is thus implicitly compensated for eddy currents. Compared to a continuously implemented pre-distortion, the gradient amplifier is not burdened in time segment $T_3$, because the gradient amplifier is not controlled by a pre-distorted quantity but instead by the referencecurrent quantity $i_{ref}$ that contains only two linear ramps and one flat plateau in the time segment $T_3$.

The above description for the time segment $T_3$ is analogously valid for the time segment $T_5$.

Although modifications and changes may be suggested by those skilled in the art, it is the intention of the inventor to embody within the patent warranted hereon all changes and modifications as reasonably and properly come within the scope of his contribution to the art.

I claim as my invention:

1. In a magnetic resonance tomography apparatus having a gradient coil which produces a gradient field according to a temporally variable reference quantity and having a radio-frequency system which emits a radio-frequency signal during a transmission time segment and which receives a radio-frequency signal in a reception time segment, said magnetic resonance apparatus having at least one component in which eddy currents are produced by said gradient field, a method for prescribing a said temporally variable reference quantity comprising:

generating said temporally variable reference quantity with no pre-distortion of said reference quantity for compensating said eddy currents in a first time segment that is not a transmission time segment or a reception time segment for said radio-frequency signal, and with a pre-distortion of said reference quantity for compensating said eddy currents in a second time segment that is a transmission time segment or a reception time segment for said radio-frequency signal.

2. A method as claimed in claim 1 wherein said gradient coil has a current therein which produces said gradient field, and wherein said method is further defined by producing said reference quantity for said current of said gradient coil.

3. A method as claimed in claim 1 comprising producing said reference quantity in said first time segment for setting a $0^{th}$ time moment of said gradient field.

4. A method as claimed in claim 3 comprising setting said $0^{th}$ time movement of said gradient field to zero.

5. A method as claimed in claim 1 comprising employing a value for said reference quantity at a start of said first time segment prescribed by a value of said reference quantity at an end of an immediately chronologically preceding time segment.

6. A method as claimed in claim 1 comprising setting a value for said reference quantity at an end of said first time segment by prescribing a value of said reference quantity at a start of an immediately chronologically following time segment.

7. A method as claimed in claim 1 wherein said gradient field has a temporally constant value during said second time segment, and wherein said method comprises producing said pre-distortion of said reference quantity in said second time segment based on no new eddy current being generated during said second time segment and compensating for a decaying eddy current which was generated in a temporally preceding time segment.

8. A method as claimed in claim 7 comprising describing said decaying eddy current with at least one exponential function having at least one time constant.

9. A method as claimed in claim 1 wherein said gradient field has a temporally variable value during said second time segment, and wherein said method comprises producing said pre-distortion of said reference quantity for compensating for an eddy current generated during said second time segment and for compensating for a decaying eddy current which was generated in a temporally preceding time segment.

10. A method as claimed in claim 9 wherein said gradient field has a temporally constant value during said second time segment, and wherein said method comprises producing said pre-distortion of said reference quantity in said second time segment based on no new eddy current being generated during said second time segment and compensating for a decaying eddy current which was generated in a temporally preceding time segment.

11. A method as claimed in claim 1 comprising determining said reference quantity closed for at least one of said time segments temporally before an output of said reference quantity.

* * * * *